US012808961B2

(12) United States Patent
Wild et al.

(10) Patent No.: US 12,808,961 B2
(45) Date of Patent: Nov. 24, 2026

(54) NUCLEAR MAGNETIC RESONANCE

(71) Applicant: THE UNIVERSITY OF SHEFFIELD, Sheffield (GB)

(72) Inventors: James M Wild, Sheffield (GB); Madhwesha Rama Rao, Sheffield (GB)

( * ) Notice: Subject to any disclaimer, the term of this patent is extended or adjusted under 35 U.S.C. 154(b) by 299 days.

(21) Appl. No.: 18/573,551

(22) PCT Filed: Jun. 23, 2022

(86) PCT No.: PCT/GB2022/051618
§ 371 (c)(1),
(2) Date: Dec. 22, 2023

(87) PCT Pub. No.: WO2022/269276
PCT Pub. Date: Dec. 29, 2022

(65) Prior Publication Data

US 2024/0288520 A1 Aug. 29, 2024

(30) Foreign Application Priority Data

Jun. 24, 2021 (GB) ..................................... 2109100

(51) Int. Cl.
*G01R 33/36* (2006.01)
*G01R 33/62* (2006.01)

(52) U.S. Cl.
CPC ..... *G01R 33/3635* (2013.01); *G01R 33/3621* (2013.01); *G01R 33/62* (2013.01)

(58) Field of Classification Search
CPC ........................... G01R 33/36; G01R 33/3607; G01R 33/3621; G01R 33/3628; G01R 33/3635; G01R 33/3678; G01R 33/62
See application file for complete search history.

(56) References Cited

U.S. PATENT DOCUMENTS

| | | | | |
|---|---|---|---|---|
| 5,144,240 A * | 9/1992 | Mehdizadeh | .... G01R 33/34046 324/318 |
| 5,680,047 A | 10/1997 | Srinivasan | |
| 10,488,475 B2 | 11/2019 | Ha | |
| 12,007,458 B2 * | 6/2024 | Miyazaki | ........... G01R 33/4828 |
| 2004/0137872 A1 | 7/2004 | Srinivasan | |
| 2007/0262777 A1 * | 11/2007 | Warntjes | ............ G01R 33/3657 324/318 |

(Continued)

FOREIGN PATENT DOCUMENTS

| | | |
|---|---|---|
| WO | WO2008116071 | 9/2008 |
| WO | 2020051716 | 3/2020 |

OTHER PUBLICATIONS

International Search Report from corresponding International Application No. PCT/GB2022/051618 dated Dec. 29, 2022.

(Continued)

*Primary Examiner* — Steven L Yeninas
(74) *Attorney, Agent, or Firm* — Ruggiero McAllister & McMahon LLC

(57) ABSTRACT

A passive filter circuit, for simultaneous dual-nuclear magnetic resonance quadrature transmit-receive that is configured to apply to an input a quadrature phase shift of a first polarity at a Larmor frequency of a first nucleus and a quadrature phase difference of a second polarity, that is opposite the first polarity, at the Larmor frequency of a second nucleus.

24 Claims, 6 Drawing Sheets

(56) References Cited

U.S. PATENT DOCUMENTS

| | | | | |
|---|---|---|---|---|
| 2007/0279061 | A1* | 12/2007 | Erickson | G01R 33/5659 324/322 |
| 2013/0127469 | A1* | 5/2013 | Biber | G01R 33/36 324/322 |
| 2014/0097838 | A1 | 4/2014 | Potter | |
| 2021/0132166 | A1* | 5/2021 | Tomiha | G01R 33/543 |

OTHER PUBLICATIONS

Written Opinion from corresponding International Application No. PCT/GB2022/051618 dated Dec. 29, 2022.
Combined Search and Examination Report from corresponding UK Application No. 2109100.4 dated Mar. 21, 2022.
Action dated May 28, 2026 in corresponding Japanese application No. 2023-579609 with English translation.

* cited by examiner

NUCLEAR MAGNETIC RESONANCE

TECHNOLOGICAL FIELD

Embodiments of the present disclosure relate to nuclear magnetic resonance (NMR)

BACKGROUND

An NMR apparatus provides a static longitudinal magnetic field ($B_0$) and an oscillating transverse magnetic field ($B_1$) at a Larmor frequency. The $B_1$ field is orthogonal to the $B_0$ field and is generated using radio frequency (RF) coils resonating at the Larmor frequency. The Larmor frequency is determined by a gyromagnetic ratio of the subject nucleus and a strength of the static magnetic field ($B_0$). The polarity (sign) of gyromagnetic ratio of the subject nucleus determines a required angular direction of rotation of the $B_1$ field (a handedness of circular polarization of the $B_1$ field). The required handedness of circular polarization changes with the polarity of the gyromagnetic ratio.

Under the influence of an external static field ($B_0$), the angular momentum of the nuclear spin for nuclei with positive gyromagnetic ratio and for nuclei with negative gyromagnetic ratio will be aligned in opposite directions. For a dual-frequency NMR application for nuclei with positive and negative gyromagnetic ratios, the required circular polarization of the oscillating magnetic field ($B_1$) will thus be mutually opposite. If the nucleus with positive gyromagnetic ratio requires a clockwise circular polarization for quadrature excitation/detection, the nucleus with negative gyromagnetic ratio requires a counter-clockwise circular polarization for quadrature excitation/detection.

BRIEF SUMMARY

According to various, but not necessarily all, embodiments there are provided examples as claimed in the appended claims.

According to various, but not necessarily all, embodiments there are provided a passive filter circuit, for simultaneous dual-nuclear magnetic resonance quadrature transmit-receive that is configured to apply to an input a quadrature phase shift (phase difference) of a first polarity at a Larmor frequency of a first nucleus and a quadrature phase shift (phase difference) of a second polarity, that is opposite the first polarity, at the Larmor frequency of a second nucleus.

BRIEF DESCRIPTION

Some examples will now be described with reference to the accompanying drawings in which.

DETAILED DESCRIPTION

In the following examples, simultaneous dual-nuclear magnetic resonance for two nuclei that have gyromagnetic ratio of opposite polarity, is achieved by simultaneously tuning to the transverse component of the precessing spin magnetization vectors of the nuclei. The spin magnetization vectors precess at different Larmor frequencies and in different directions (polarities) for the two nuclei. The transverse component of the precessing spin magnetization vectors are rotating phasors in the transverse plane. The phasors rotate at different Larmor frequencies and in different directions for the two nuclei.

To achieve the desired tuning, the NMR system transmits-receives a first transverse magnetic field for the first nucleus and a second transverse magnetic field for the second nucleus. The first transverse magnetic field is a rotating phasor in the transverse plane that has a Larmor frequency and direction of rotation to match the transverse component of the precessing spin magnetization vector for the first nucleus. The second transverse magnetic field is a rotating phasor in the transverse plane that has a Larmor frequency and direction of rotation to match the transverse component of the precessing spin magnetization vector for the second nucleus, and is opposite to the direction of rotation of the first transverse magnetic field.

Figure 1A:
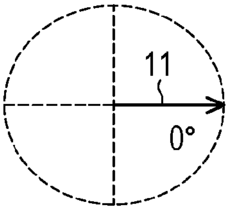
FIG. 1A shows an in-phase signal and FIG. 1B shows a quadrature signal that has a quadrature phase offset from the in-phase signal of +90° (−270°) and a quadrature signal that has a quadrature phase offset from the in-phase signal of −90°.
Figure 1B:
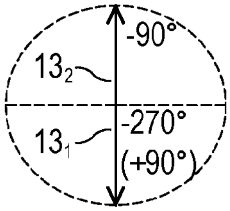

Quadrature phase operation is associated with a rotating phasor in the transverse plane. The rotating phasor can be represented by an in-phase signal in one direction and a quadrature signal in another mutually orthogonal direction. When the quadrature signal has a quadrature phase offset from the in-phase signal of +90°, the phasor rotates in one direction and when it has a quadrature phase offset from the in-phase signal of −90° the phasor rotates in the opposite direction FIG. 1A illustrates an in-phase signal. FIG. 1B illustrate a quadrature signal that has a quadrature phase offset from the in-phase signal of +90° (−270°) and a quadrature signal that has a quadrature phase offset from the in-phase signal of −90°.

The objective is to achieve a quadrature phase shift (phase difference) of a first polarity at a Larmor frequency of a first nucleus and a quadrature phase shift (phase difference) of a second polarity, that is opposite the first polarity, at the Larmor frequency of a second nucleus.

This can be achieved at transmission and/or at reception.

The following description relates to a passive filter circuit 10, for simultaneous dual-nuclear magnetic resonance quadrature transmit-receive that is configured to apply to an input a quadrature phase shift (phase difference) of a first polarity at a Larmor frequency of a first nucleus and a quadrature phase shift (phase difference) of a second polarity, that is opposite the first polarity, at the Larmor frequency of a second nucleus.

The input could be an input for subsequent transmission or a received input.

The passive filter circuit 10 can, for example, be implemented as a second-order filter or a higher order filter. For example, a second-order filter that has two-zeros or a third-order filter that has three-zeros.

The second-order filter can, for example, have a first resonance at the Larmor frequency of a first nucleus and a second resonance at the Larmor frequency of a second nucleus. The first and second resonances are isolated and distinct, that is they are not covered by a single broadband resonance. In some but not necessarily all examples, there can be a substantially similar, low insertion loss at the Larmor frequency of the first nucleus and the Larmor frequency of the second nucleus.

Figure 2:
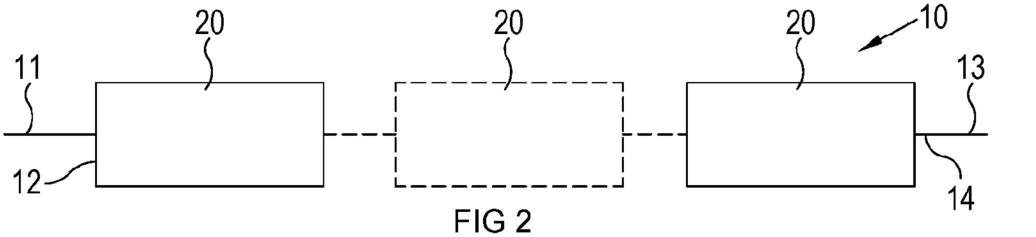
FIG. 2 shows a passive filter circuit comprising multiple cascaded filter modules.

As illustrated in FIG. 2, the passive filter circuit 10 can comprise multiple cascaded filter modules 20. The multiple filter modules 20 are connected in series.

In some but not necessarily all examples, the cascaded filter modules 20 are the same.

Each cascaded filter module 20 is configured to provide a relative phase shift (phase change) that in combination across the passive filter circuit 10 results in an output 14 that, compared to an input signal 11, has a quadrature phase shift (phase change) of a first polarity at the Larmor frequency of the first nucleus and a quadrature phase shift (phase change) of the second polarity, opposite the first polarity, at the Larmor frequency of the second nucleus.

The input signal 11 at the input 12 corresponds to FIG. 1A and the output signal 13 at the output 14 corresponds to FIG. 1B.

Figure 3:
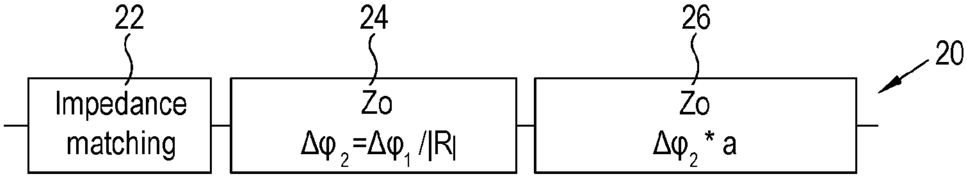
FIG. 3 illustrates an example of a filter module.

FIG. 3 illustrates an example of a filter module 20. The filter module 20 comprises an optional impedance matching block 22, a phase rotation block 24 and a phase offset block 26.

The phase rotation block 24 comprises circuitry configured to apply a first phase shift (phase difference) $\Delta\varphi_1$, in a first sense, at the Larmor frequency of the first nucleus, for a certain time delay or equivalent. The first phase shift is in proportion to the Larmor frequency of the first nucleus.

The phase rotation block 24 comprises circuitry configured to apply, simultaneously, a second phase shift (phase difference) $\Delta\varphi_2$, in the second sense, at the Larmor frequency of the second nucleus, for the same time delay or equivalent mentioned earlier. The second phase shift $\Delta\varphi_2$ is in proportion to the Larmor frequency of the second nucleus and has the same polarity as the first phase shift.

Thus, $\Delta\varphi_1/\Delta\varphi_2=|\gamma_1/\gamma_2|$, where $\gamma_1$ is the gyromagnetic ratio of the first nucleus and $\gamma_2$ is the gyromagnetic ratio of the second nucleus. Therefore $\Delta\varphi_2=\Delta\varphi_1/|R|$ where $|R|=|\gamma_1/\gamma_2|$, is the modulus value of the ratio of the gyromagnetic ratio $\gamma_1$ of the first nucleus and the gyromagnetic ratio $\gamma_2$ of the second nucleus.

In the example illustrated, a first phase shift (phase difference)+X is applied at the Larmor frequency of the first nucleus and a second phase shift (phase difference) +X/|R| is applied at the Larmor frequency of the second nucleus.

The phase offset block 26 comprises circuitry configured to apply a relative phase offset θ between the first phase shift $\Delta\varphi_1$ at the Larmor frequency of the first nucleus and the second phase shift $\Delta\varphi_2$ at the Larmor frequency of the second nucleus to create a phase difference β between the first phase shift and the second phase shift, after the offset. If the second phase shift (phase difference) after the offset is $\Delta\varphi_2*b$, then $\beta=\Delta\varphi_1-\Delta\varphi_2*b=\Delta\varphi_1(1-b/|R|)$.

The phase difference β is summed across N cascaded filter modules to provide the output 14 that has a quadrature phase shift (phase change) of a first polarity at the Larmor frequency of the first nucleus and a quadrature phase shift (phase change) of the second polarity, opposite the first polarity, at the Larmor frequency of the second nucleus.

Thus, the N relative phase differences β sum to a relative phase difference of 180°.

The offset θ between the first phase shift $\Delta\varphi_1$ at the Larmor frequency of the first nucleus and the second phase shift $\Delta\varphi_2$ at the Larmor frequency of the second nucleus creates a phase difference β between the first phase shift and the second phase shift, after the offset, that can be multiplied by a whole number to obtain a net+/−90° phase shift (phase difference) at the Larmor frequency of the first nucleus and a net−/+90° phase shift (phase difference) at the Larmor frequency of the second nucleus. The quadrature phase shift (phase difference)—at the Larmor frequency of the second nucleus has an opposite sense to the quadrature phase shift (phase difference) at the Larmor frequency of the second nucleus.

The passive filter circuit 10 can be designed so that each filter module 20 has a particular relative phase offset θ between the first phase shift $\Delta\varphi_1$ at the Larmor frequency of the first nucleus and the second phase shift $\Delta\varphi_2$ at the Larmor frequency of the second nucleus and so that the number of cascaded filter modules 20 produce a quadrature phase shift (phase difference) of a first polarity at a Larmor frequency of a first nucleus and a quadrature phase shift (phase difference) of a second polarity, that is opposite the first polarity, at the Larmor frequency of a second nucleus.

If it is desired to have simultaneous dual-nuclear magnetic resonance for different combinations of first and second nuclei with opposite polarity gyromagnetic ratios, then the passive filter circuit 10 can be designed to change the relative phase offset θ between the first phase shift $\Delta\varphi_1$ at the Larmor frequency of the first nucleus and the second phase shift $\Delta\varphi_2$ at the Larmor frequency of the second nucleus. The passive filter circuit 10 can, in some examples, be designed to change the number of cascaded filter modules 20. That is cascaded filter modules 20 can be added or subtracted to the filter circuit 10.

A specific example will now be described where the specific first nucleus is $^1H$ and the second nucleus is $^{129}Xe$. However, it should be appreciated that other combinations of first and second nuclei can be simultaneously probed using the passive filter circuit 10.

$^{1}H$ has a gyromagnetic ratio of 42.57 and $^{129}Xe$ has a gyromagnetic ratio of −11.77

The gyromagnetic ratios have opposite polarity. Thus, in the static magnetic field $B_0$, the spin magnetisation vectors are aligned in opposite directions and will precess in opposite senses.

The ratio |R| of the Larmor frequencies (also the ratio of the gyromagnetic ratios) is 3.6.

Figure 4A:
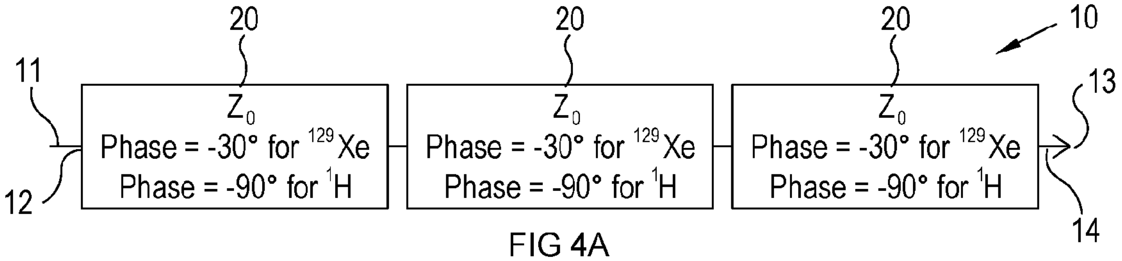
FIG. 4A illustrates a passive filter circuit for $^{1}$H and $^{129}$Xe comprising three cascaded filter modules.

As illustrated in FIG. 4A, the passive filter circuit 10 for $^{1}H$ and $^{129}Xe$ can comprise three cascaded filter modules 20. Here the cascaded filter modules 20 are all the same.

Figure 5A:
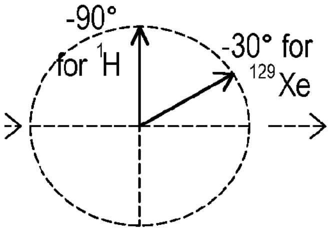
FIG. 5A illustrates a phase change effected by a filter module.
Figure 5B:
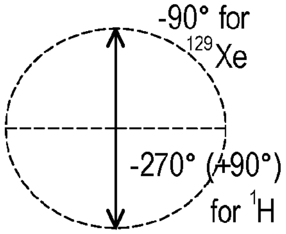
FIG. 5B illustrates a phase change effected by the passive cascaded filter circuit.

Each cascaded filter module 20 is configured to provide a phase shift (phase change) of −90° at the Larmor frequency of $^{1}H$ and of −30° at the Larmor frequency of $^{129}Xe$, as illustrated in FIG. 5A. The three cascaded filter modules 20 in combination provide a phase shift (phase change) of −270° (which is equivalent to a phase change of +90°) at the Larmor frequency of $^{1}H$ and a phase shift (phase change) of −90° at the Larmor frequency of $^{129}Xe$ as illustrated in FIG. 5B. The three cascaded filter modules 20 in combination thus provide a quadrature phase shift (phase change) of a first polarity at the Larmor frequency of $^{1}H$ and a quadrature phase shift (phase change) of the second polarity, opposite the first polarity, at the Larmor frequency of the $^{129}Xe$.

Figure 4B:
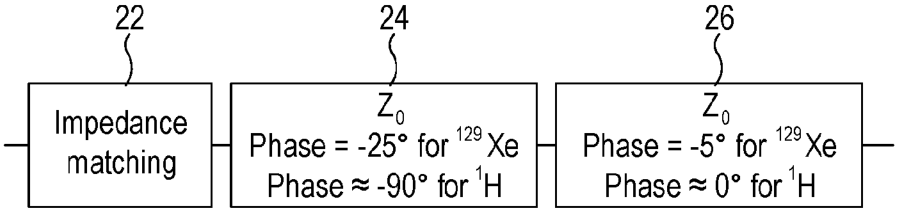
FIG. 4B illustrates an example of a filter module from FIG. 4A.

FIG. 4B illustrates an example of a filter module 20 for $^{1}H$ and $^{129}Xe$. The filter module 20 comprises an optional impedance matching block 22, a phase rotation block 24 and a phase offset block 26.

The phase rotation block 24 comprises circuitry configured to provide a first phase shift (phase difference) −90°, in a first sense, at the Larmor frequency of $^{1}H$. The first phase shift is in proportion to the Larmor frequency of $^{1}H$.

The phase rotation block 24 comprises circuitry configured to apply, simultaneously, a second phase shift (phase difference) −25°, in the first sense, at the Larmor frequency of $^{129}Xe$. The second phase shift −25 is in proportion to the Larmor frequency of $^{129}Xe$ and has the same polarity to the first phase shift.

The ratio of the phase shifts −90°/−25° is the same as the ratio $|R|=|\gamma_1/\gamma_2|=3.6$, where $\gamma_1$ is the gyromagnetic ratio of $^{1}H$ and $\gamma_2$ is the gyromagnetic ratio of $^{129}Xe$. A first phase shift −90° is applied at the Larmor frequency of 1H and a second phase shift −90°/3.6=−25° is applied at the Larmor frequency of $^{129}Xe$.

The phase offset block 26 comprises circuitry configured to apply a relative phase offset θ between the first phase shift −90° at the Larmor frequency of $^{1}H$ and the second phase shift −25° at the Larmor frequency of $^{129}Xe$ to create a phase difference β between the first phase shift and the second phase shift, after the offset. The second phase shift after the offset is −30° and the phase difference β is 60° as illustrated in FIG. 5A.

The phase difference β (60°) is summed across the three cascaded filter modules to provide the output 14 that has a quadrature phase shift (−phase change) of a first polarity (+90) at the Larmor frequency of $^{1}H$ and a quadrature phase shift (phase change) of the second polarity (−90), opposite the first polarity, at the Larmor frequency of $^{129}Xe$, as illustrated in FIG. 5B.

In this example, the circuitry of the phase rotation block 24 is configured to apply a −90° phase shift at the Larmor frequency of the $^{1}H$ nucleus and apply a substantially −25° phase shift at the Larmor frequency of the $^{129}Xe$ nucleus and the circuitry of the offset block 26 is configured to apply an offset of substantially −5° phase shift at the Larmor frequency of the $^{129}Xe$ nucleus compared to the Larmor frequency of the $^{1}H$ nucleus.

Figure 6:
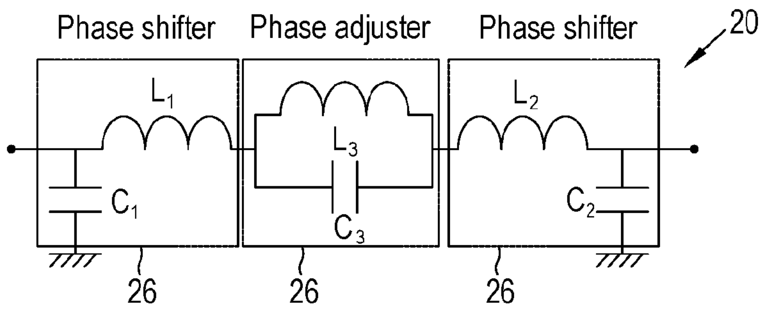
FIG. 6 illustrates an example of a filter module.

FIG. 6 illustrates an example of a filter module 20. The filter module 20 is a second-order filter that has two-zeros.

Figure 7A:
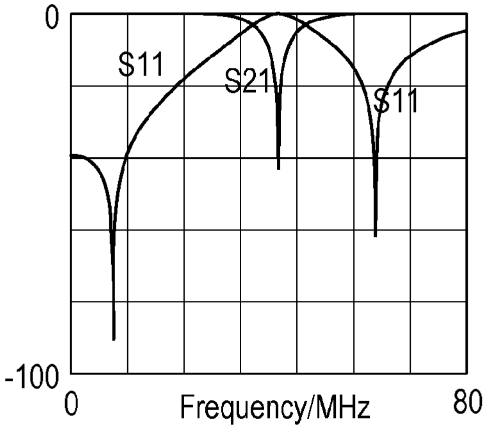
FIGS. 7A and 7B illustrates the magnitude and phase of the S-parameter S11 and S21 for the filter module.
Figure 7B:
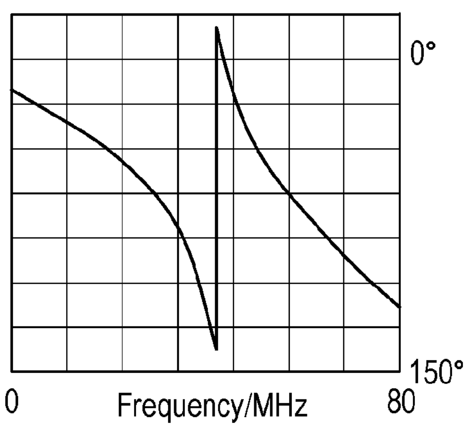

FIG. 7A illustrates the magnitude of the S-parameters S11 and S21 for the filter module 20 illustrated in FIG. 6. FIG. 7B illustrates the argument (phase) of the S-parameter S12 for the filter module 20 illustrated in FIG. 6. In the FIGs the label m1 is at 17.65 MHz, the $^{129}Xe$ Larmor frequency and the label m2 is at 63.86 MHz, the $^{1}H$ Larmor frequency.

The filter module 20 is second-order and has a first resonance at the Larmor frequency of the first nucleus and a second resonance at the Larmor frequency of the second nucleus. The first and second resonances are isolated and distinct, that is they are not covered by a single broadband resonance. In the example illustrated, the S11 plot in FIG. 7A has two narrow passbands one at the Larmor frequency of $^{1}H$ (m2) and one at the Larmor frequency of $^{129}Xe$ (m1).

There can be a substantially similar, low insertion loss at the Larmor frequency of the first nucleus and the Larmor frequency of the second nucleus.

FIG. 7B illustrates the phase of the S-parameter S12 for the filter module 20 illustrated in FIG. 6. In the example illustrated, the S11 plot has a phase shift (phase difference) of substantially −90° at the Larmor frequency of $^{1}H$ (m2) and a phase shift (phase difference) of substantially −30° at the Larmor frequency of $^{129}Xe$ (m1).

The filter module 20 comprises two parallel paths to ground (earth) from respective ports via capacitors C1 and C2. An LC network is connected between the ports. The LC network comprises one or more inductors (L1, L2) in series with a parallel LC circuit. The parallel LC circuit comprises an inductor L3 and, in parallel, a capacitor C3. The LC network separating the two paths to ground provides the separation of the two resonances (two zeros). The tuning of the resonances and the phase shift (phase difference) is obtained by selecting appropriate values for the components C1, C2, C3, L1, L2, L3.

In the example illustrated but not necessarily all examples, the LC network is symmetric comprising in series the inductor L1, the parallel LC circuit and the inductor L2. However, in other examples the inductors L1 and L2 can be combined as a single inductor, such that only one of the inductors with the combined value is used. Inductor symmetry is not mandatory.

In the example illustrated but not necessarily all examples, the capacitors C1 and C2 are symmetric and have the same values.

In the example illustrated, the reflection s-parameters (S11) and the transfer s-parameters (S12) characteristics illustrated in FIGS. 7A and 7B can be obtained by using the values 89 nH for L1, L2; 49 pF for C1, C2; 46 nH for L3 and 252 pF for C3. This produces a resonance at the Larmor frequency of $^{1}H$ (m2) which is 63.86 MHz and a resonance at the Larmor frequency of $^{129}Xe$ (m1) which is 17.65 MHz for this particular static $B_0$ field.

Circuit simplicity arise from the fact that the capacitor value required for C1 and C2 for phase shift $\Delta\varphi_1$ for first nuclei (−90° at $^{1}H$ Larmor frequency) and $\Delta\varphi_2$ for second nuclei (−30° at $^{129}Xe$ Larmor frequency) is the same, and thus, no additional component is required for impedance matching. This is because, $$\left| R\left(1-\cos\frac{\pi}{2}\frac{1}{N}\right)\left[\sin\frac{\pi}{2}\frac{1}{N}\right]^{-1}\right| \approx 1.$$

Where N is the number of cascaded blocks.

In some examples, the values of the components e.g. C1, C2, C3, L1, L2, L3 can be variable, so that the filter module 20 can be adapted to operate for different values of static $B_0$ field. The same circuit topology can be used, there is provided means for proportionally changing the component values.

In some examples, the values of the components e.g. C1, C2, C3, L1, L2, L3 can be variable, so that the filter module 20 can be adapted to operate for different combinations of first and second nucleus.

The combination of inductor L1 and capacitor C2 and the combination of inductor L2 and capacitor C1 provide the phase rotation block 24 and the combination of the inductor L3 and the capacitor C3 provide the phase offset block 26.

Figure 8:
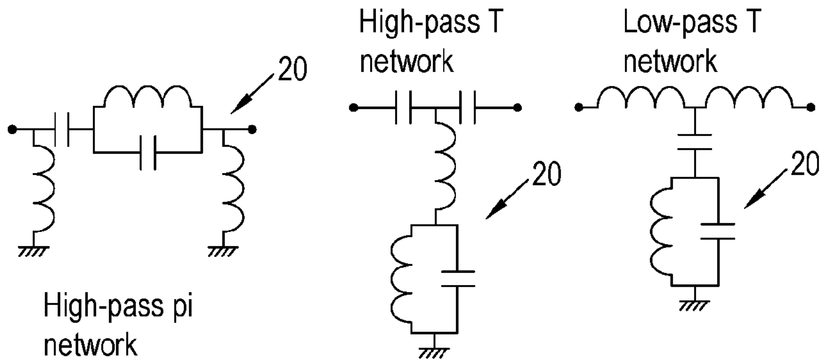
FIG. 8 illustrates other examples of filter modules.

The filter module 20 in FIG. 6 is a low-pass pi network. The filter modules 20 can be implemented using other circuits such as a high-pass pi network, a low-pass T network and a high-pass T network as illustrated in FIG. 8.

Figure 9:
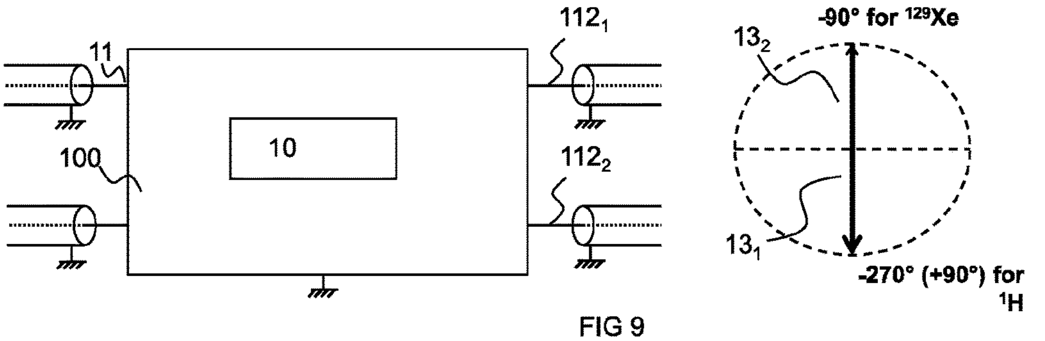
FIG. 9 illustrates an example of an apparatus for simultaneous dual nuclear magnetic resonance quadrature transmit-receive.

FIG. 9 illustrates an example of an apparatus 100 for simultaneous dual nuclear magnetic resonance quadrature transmit-receive. The apparatus 100 comprises one or more passive filter circuits 10 as previously described.

The apparatus 100 is configured to provide a first outputs $\mathbf{112}_1$ and $\mathbf{112}_2$ with a quadrature phase shift (phase difference) of a first polarity at a Larmor frequency of a first nucleus and also simultaneously provide quadrature phase shift (phase difference) of a second polarity, opposite the first polarity, at the Larmor frequency of a second nucleus.

In the example illustrated, the first nucleus is $^1$H and the second nucleus is $^{129}$Xe. The first outputs $\mathbf{112}_1$ and $\mathbf{112}_2$ provide a first output signal $\mathbf{13}_1$ that has a quadrature phase shift (phase difference), compared to in-phase, of a first polarity at a Larmor frequency of a first nucleus and a second output signal $\mathbf{13}_2$ that has a quadrature phase shift (phase difference) of a second polarity, opposite the first polarity, at the Larmor frequency of a second nucleus. However, the apparatus 100 can operate with different combinations of nuclei that have opposite polarity gyromagnetic ratios.

The apparatus 100 is configured to provide a first output $\mathbf{112}_1$ and $\mathbf{112}_2$ with a quadrature phase shift (phase difference) between them, of +90° (−270°) at the Larmor frequency of $^1$H and of −90° (opposite polarity) at the Larmor frequency of $^{129}$Xe.

The apparatus 100 operates as a quadrature hybrid coupler that splits RF power into in-phase (0°) and quad-phase (+/−90°) RF power at its outputs $\mathbf{112}_1$ and $\mathbf{112}_2$.

The apparatus 100 can be coupled, via its outputs $\mathbf{112}_1$, $\mathbf{112}_2$, to a quadrature or circularly polarised RF coil arrangement 204 to produce transverse magnetic fields of opposite circular polarization.

Figure 10A:
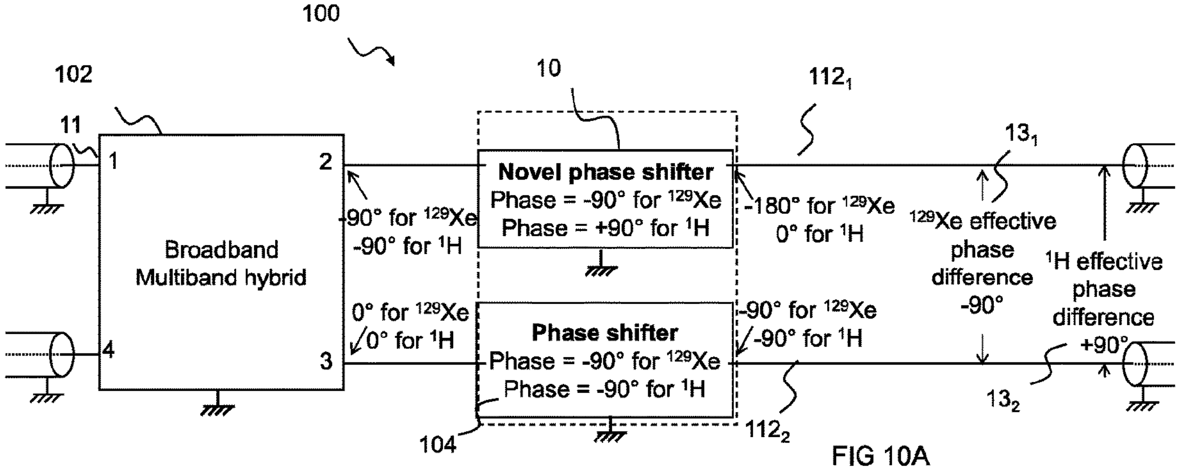
FIG. 10A illustrates a implementation of the apparatus using standard broadband hybrid.

FIG. 10A illustrates an example implementation of the apparatus 10 used in conjunction with a standard/typical broadband or multiband hybrid coupler.

In this example an input to a broadband or multiband hybrid coupler 102 is converted to an in-phase output at port 3 and a quadrature phase output at port 2. This is a standard broadband or multiband hybrid coupler and the same quadrature phase shift (phase difference) is produced at the Larmor frequency of the first nucleus (e.g. $^1$H) and the Larmor frequency of the second nucleus (e.g. $^{129}$Xe).

The in-phase output from the port 3 passes through a conventional broadband phase shifter 104 to the second output $\mathbf{112}_2$. The same quadrature phase shift (phase difference) is added at the Larmor frequency of the first nucleus (e.g. $^1$H) and the Larmor frequency of the second nucleus (e.g. $^{129}$Xe).

The quadrature phase output from the port 2 passes through the passive filter circuit 10 to the first output $\mathbf{112}_1$. Different quadrature phase shifts (phase differences) are added at the Larmor frequency of the first nucleus (e.g. $^1$H) and the Larmor frequency of the second nucleus (e.g. $^{129}$Xe). The different quadrature phase shifts (phase differences) are a quadrature phase shift (phase difference) of a first polarity at the Larmor frequency of the first nucleus and a quadrature phase shift (phase difference) of a second polarity, that is opposite the first polarity, at the Larmor frequency of the second nucleus.

The output ports $\mathbf{112}_1$ and $\mathbf{112}_2$ of the passive filter circuit 10 and the conventional broadband phase shifter 104 produces a differential first output signal $\mathbf{13}_1$ that has a quadrature phase shift (phase difference) of a first polarity at the Larmor frequency of the first nucleus and a differential second output signal $\mathbf{13}_2$ that has a quadrature phase shift (phase difference) of a second polarity, that is opposite to the first polarity, at the Larmor frequency of a second nucleus.

Figure 10B:
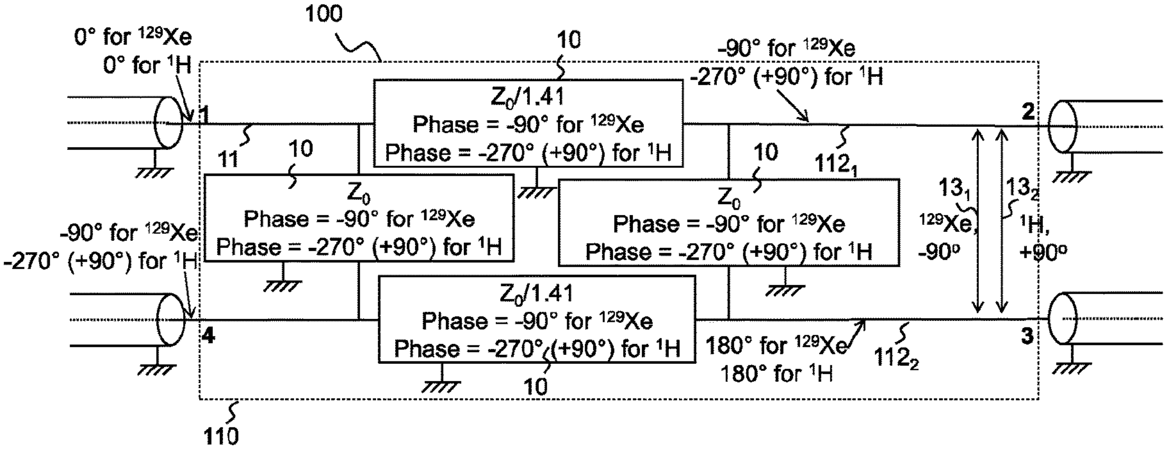
FIG. 10B illustrates typical implementation of the apparatus where a network of passive filter circuits is configured to provide a dual-mode quadrature hybrid circuit.

FIG. 10B illustrates an example implementation of the apparatus 100. A network of passive filter circuits 10 is configured to provide a dual-mode quadrature hybrid circuit 110.

In this example an input to the dual-mode quadrature hybrid circuit 110 at port 1 is converted to an in-phase output at port 3 (the second output $\mathbf{112}_2$) and a quadrature phase output at port 2 (the first output $\mathbf{112}_1$). The output between port 2 and port 3 of the dual-mode quadrature hybrid circuit 110 provides a first output signals $\mathbf{13}_1$ that has a quadrature phase shift (phase difference) of a first polarity at the Larmor frequency of the first nucleus and a second output signal $\mathbf{13}_2$ that has a quadrature phase shift (phase difference) of a second polarity, that is opposite the first polarity, at the Larmor frequency of the second nucleus.

The dual-mode quadrature hybrid circuit 110 comprises multiple passive filter circuits 10 as previously described including at least one passive filter circuit 10 connected between the first output $\mathbf{112}_1$ and the second output $\mathbf{112}_2$.

The example of a dual-mode quadrature hybrid circuit 110 illustrated in FIG. 10B has a passive filter circuit 10 connected between the port 1 and port 2; a passive filter circuit 10 connected between the port 2 and port 3; a passive filter circuit 10 connected between the port 3 and port 4; and a passive filter circuit 10 connected between the port 4 and port 1. However, the characteristic impedance of these passive filter 10 vary in accordance with typical hybrid coupler design.

Each passive filter circuit 10 adds a different quadrature phase shift (phase difference) at the Larmor frequency of the first nucleus (e.g. $^1$H) and the Larmor frequency of the second nucleus (e.g. $^{129}$Xe). The different quadrature phase shifts (phase differences) are a quadrature phase shift (phase difference) of a first polarity at the Larmor frequency of the first nucleus and a quadrature phase shift (phase difference) of a second polarity, that is opposite the first polarity, at the Larmor frequency of the second nucleus.

Figure 11:
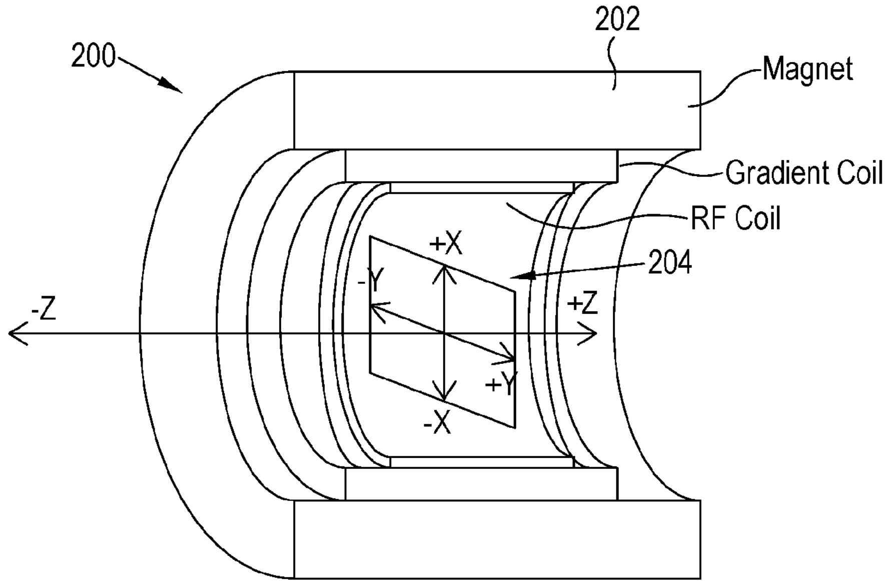
FIG. 11 illustrates an example of a nuclear magnetic resonance (NMR) system.

FIG. 11 illustrates an example of a nuclear magnetic resonance (NMR) system 200 A magnet 202 provides a longitudinal magnetic field $B_0$ in direction z. Radio frequency coils 204 provide a transverse magnetic field $B_1$ in the x-y plane that is orthogonal to Z.

Figure 12:
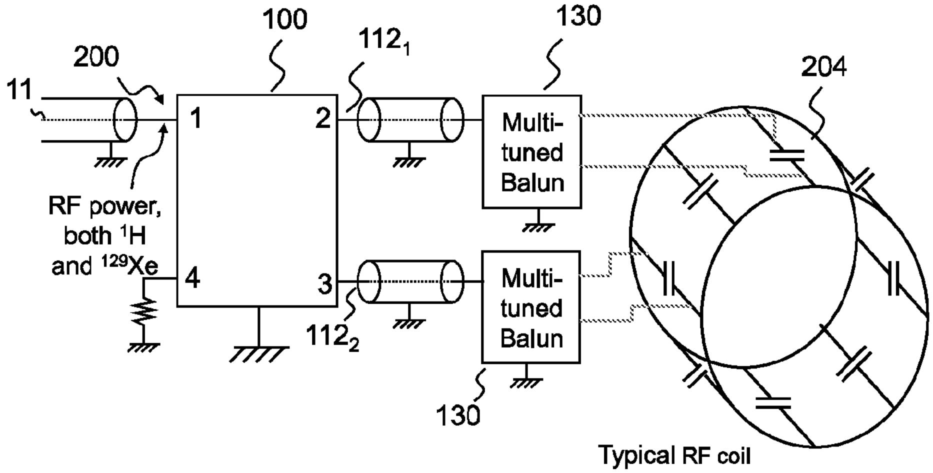
FIG. 12 illustrates an example of a nuclear magnetic resonance (NMR) system.

The apparatus 100 for simultaneous dual nuclear magnetic resonance quadrature transmit-receive is used to transmit radio frequency power via the radio frequency coils 204 and also to receive radio frequency power via the radio frequency coils 204. FIG. 12 illustrates an example of the apparatus 100 coupled to a radio frequency coil arrangement 204. In this example, but not necessarily all examples, the apparatus 100 connects to the radio frequency coils 204 via one or more baluns. A balun 130 produces differential output signals that correspond to input signals $13_1$, $13_2$ from the apparatus 100.

The apparatus 100 is configured to provide a first output signals $13_1$ with a quadrature phase shift (phase difference) of a first polarity at a Larmor frequency of a first nucleus and to provide a second output signals $13_2$ with a quadrature phase shift (phase difference) of a second polarity, opposite the first polarity, at the Larmor frequency of a second nucleus.

During transmission, the first output signals $13_1$ produces, via the RF coils 204, a first circularly polarized magnetic field that couples with a spin magnetization vector of the first nucleus and the second output signals $13_2$ produces, via the same or different RF coils 204, a second circularly polarized magnetic field that couples with a spin magnetization vector of the second nucleus. The circular polarizations of the first and second magnetic fields have opposite handedness (angular direction)—one is left circular polarized and the other is right circular polarized.

During reception, the first output signals $13_1$ detects, via the RF coils 204, a first circularly polarized magnetic field that couples with a spin magnetization vector of the first nucleus and the second output signal $13_2$ detects, via the same or different RF coils 204, a second circularly polarized magnetic field that couples with a spin magnetization vector of the second nucleus. The circular polarizations of the first and second magnetic fields have opposite handedness (angular direction)—one is left circular polarized and the other is right circular polarized.

The system 200 is configured as a transmitter for simultaneous dual nuclear magnetic resonance and/or a receiver for simultaneous dual nuclear magnetic resonance quadrature transmit-receive.

In this example, but not necessarily all examples, the same radio frequency coils 204 are used for producing both the first and second magnetic fields. In other examples, different radio frequency coils 204 can be used for producing the first and second magnetic fields.

The system 200 comprises a first coil arrangement 204 coupled to the outputs $112_1$ and $112_2$ with the quadrature phase shift (phase difference) of the first polarity at the Larmor frequency of the first nucleus to produce a first magnetic field and with the quadrature phase shift (phase difference) of the second polarity, opposite the first polarity, at the Larmor frequency of a second nucleus to produce a second magnetic field, wherein one of the first magnetic field and the second magnetic field is right circularly polarized and the other one of the first magnetic field and the second magnetic field is left circularly polarized.

The system 200 provides for simultaneous dual nuclear magnetic resonance on the first nucleus and the second nucleus where the first nucleus and the second nucleus have gyromagnetic ratios of opposite polarity. The system 200 can comprise the passive filter circuit 10 and/or the apparatus 100. The system 200 is configured for simultaneous dual nuclear magnetic resonance on the first nucleus and the second nucleus without using time divided switching.

Figure 13:
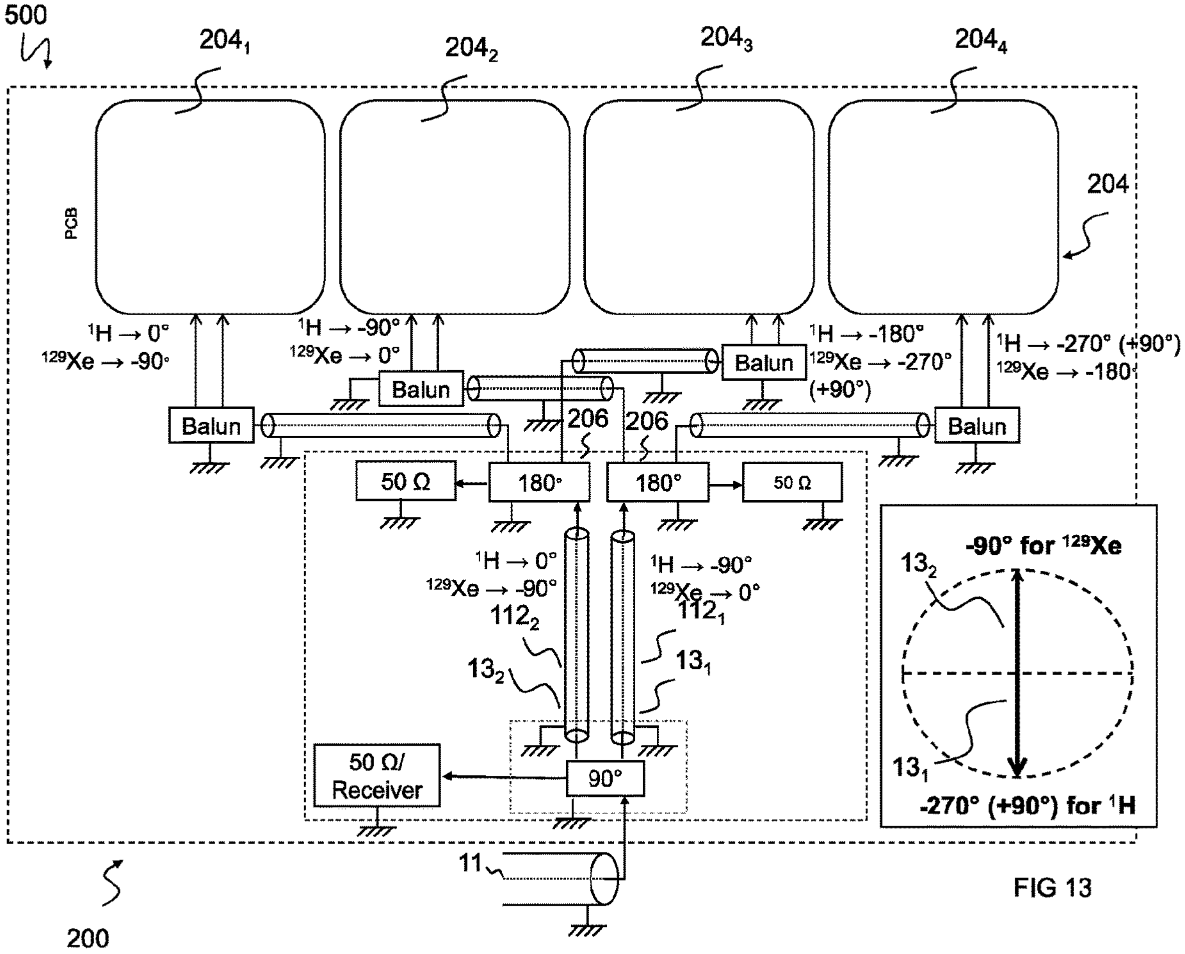
FIG. 13 illustrates an example of a nuclear magnetic resonance (NMR) system.

FIG. 13 is a system 200 similar to that illustrated in FIG. 12. In FIG. 12, the RF coil arrangement 204 is a circularly polarized arrangement where a single birdcage coil is used for both the first nucleus and the second nucleus. However, in FIG. 13 the RF coil arrangement 204 is a quadrature coil arrangement where separate RF coils are used for generating orthogonal components of the transverse magnetic field. The outputs from coupler 206 therefore couple to different coils $204_j$.

The coupler 206 can be a broadband or multiband 180 degree power divider (sometimes known as rat race coupler or a Wilkinson splitter).

The pair of coils $204_1$, $204_3$ are positioned on opposite sides of a subject. The pair of coils $204_2$, $204_4$ are positioned on opposite sides of a subject. Pairs $204_1$-$204_2$, $204_2$-$204_3$, $204_3$-$204_4$ and $204_4$-$204_1$ produce orthogonal components of the transverse magnetic field.

The coils $204_1$, $204_2$, $204_3$, $204_4$ at the Larmor frequency of the first nucleus (e.g. $^1H$) produce transverse magnetic field components that are in quadrature and produce a first magnetic field with a first circular polarization. The phase shift (phase difference) between the coils $204_1$, $204_2$, $204_3$, $204_4$ changes by steps −90° at the Larmor frequency of the first nucleus (e.g. $^1H$).

The coils $204_1$, $204_2$, $204_3$, $204_4$ at the Larmor frequency of the second nucleus (e.g. $^{129}Xe$) produce transverse magnetic field components that are in quadrature and produce a second magnetic field with a second circular polarization. The phase shift (phase difference) between the coils $204_1$, $204_2$, $204_3$, $204_4$ changes by steps +90° at the Larmor frequency of the second nucleus (e.g. $^{129}Xe$). The first polarization and the second polarization have opposite handedness (angular direction) at the subject.

The output signals $13_1$ and $13_2$ can be defined using the outputs $112_1$ and $112_2$ The first output signals $13_1$ provides a phase shift (phase difference) of +90° at the Larmor frequency of the first nucleus (e.g. $^1H$). The second output signal $13_2$ provides a phase shift (phase difference) of −90° at the Larmor frequency of the first nucleus (e.g. $^1H$).

The signal from the output $112_1$ is split by a power divider/rat race coupler 206 into an in-phase signal coupled to the coil $204_1$ and an anti-phase signal coupled to the coil $204_3$.

The signal from the output $112_2$ is split by a power divider/rat race coupler 206 into an in-phase signal coupled to the coil $204_2$ and an anti-phase signal coupled to the coil $204_4$.

The system 200 illustrated in FIG. 13 can be implemented as a wearable system dual tuned quadrature transceiver array coil that is worn by the subject and is ergonomically fitted to the subject as a jacket design. When used in conjunction with the claimed design feature of dual-tuned hybrid with counter-rotating quadrature for transmit-receive for both $^1H$ and $^{129}Xe$ signals, the same wearable coil can be interfaced to the MRI system with a single passive circuit design that does not require mechanical or electrical switching.

In some examples, the jacket 500 at least partially encloses subject. For example, the jacket 500 can we worn on an upper torso of a human. In some examples, the jacket 500 can be designed to be over the shoulder. The coil arrangement 204 can therefore be configured as a jacket 500 to be worn by a subject, for example a human subject. In some examples, the jacket 500 is fitted to the subject by some attachment.

The jacket 500 can be passive. In some examples, the jacket 500 comprises the coils 204 and all or part of the apparatus 100. In this example, the jacket 500 can comprise one or more passive filter circuits 10. For example, in some but not necessarily all examples, the jacket 500 can comprise the dual-mode quadrature hybrid circuit 110. In other examples, the passive jacket 500 comprises the coils 204 but does not comprise the apparatus 100 which is connected to the jacket 500.

The jacket can, for example, probe first and/or second nuclei. It can for example, be used with one or more passive filters 10 to simultaneously probe a combination of first and second nuclei of opposite polarity gyromagnetic ratio.

It should however be noted that the jacket 500 could, for example, be used with other circuitry, such as active switching circuitry, to simultaneously probe a combination of first and second nuclei that have gyromagnetic ratios of opposite polarity (opposite polarity gyromagnetic ratios).

Thus, the passive jacket 500, for dual-nuclear magnetic resonance quadrature transmit-receive on a subject, comprising circuitry configured to produce-detect a first magnetic field that has a first circular polarization at a Larmor frequency of a first nucleus and to produce-detect a second magnetic field that has a second circular polarization at a Larmor frequency of a first nucleus, where the first circular polarization is opposite the second polarization at the subject.

In at least some examples, the passive jacket 500 comprises at least a first pair of coils 204 for producing a first component of a transverse magnetic field and at least a second pair of coils 204 for producing a second component of the transverse magnetic field, and means for calibrating alignment of the first pair of coils and/or alignment of the second pair of coils.

In at least some examples, the passive jacket 500 comprises a passive filter circuit 10 configured to apply to an input a quadrature phase shift (phase difference) of a first polarity at a Larmor frequency of a first nucleus and a quadrature phase shift (phase difference) of a second polarity, that is opposite the first polarity, at the Larmor frequency of a second nucleus to control the first circular polarization to be opposite the second circular polarization.

The system 200 can for example comprise calibration circuitry that enables adjustment of the wearable system so that the coils $\mathbf{204}_1$, $\mathbf{204}_3$ are sufficiently aligned and the coils $\mathbf{204}_2$, $\mathbf{204}_4$ are sufficiently aligned.

The system 200 therefore comprises a coil arrangement 203 that comprises first coils $\mathbf{204}_2$, $\mathbf{204}_4$ coupled to the first output $\mathbf{112}_1$ via a balun 130 to produce the first magnetic field and comprises second coils $\mathbf{204}_1$, $\mathbf{204}_3$ coupled to the second output $\mathbf{112}_1$ via a balun 130 to produce the second magnetic field, wherein in use the first magnetic field is substantially in a first direction and the second magnetic field is substantially in a second direction orthogonal to the first direction.

Inductive coupling to the subject is a key measure of RF coil performance, and is higher for higher frequencies or larger sized RF coils. Where there is a large difference between gyromagnetic ratio of the first nucleus and the second nucleus, there will be a large difference in Larmor frequencies and this difference will increase with increasing applied static field $B_0$. Sensitivity for a RF coil of particular dimension can therefore be different for the first nucleus and for the second nucleus. For example, sensitivity for a RF coil of particular dimension is less for $^{129}$Xe than for $^{1}$H.

In some examples, it may be desirable to use different RF coils 204 for NMR of the first nucleus and for NMR of the second nucleus.

A larger, or otherwise more sensitive RF coil 204 can be used for NMR of the nucleus with the smaller gyromagnetic ratio.

Figure 14:
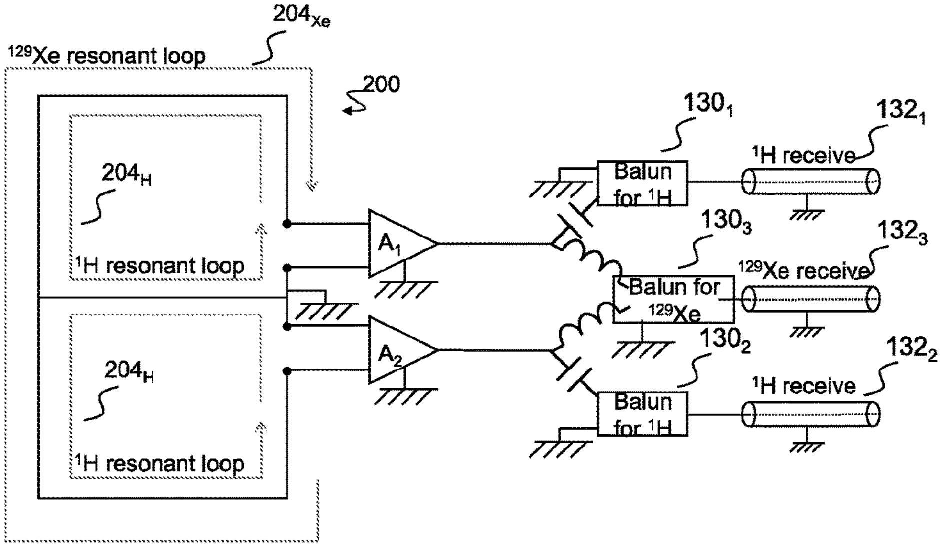
FIG. 14 illustrates an example of a nuclear magnetic resonance (NMR) system.

In FIG. 14, a larger coil $\mathbf{204}_{Xe}$ is used for NMR of $^{129}$Xe and a smaller coil $\mathbf{204}_H$ is used for NMR of $^{1}$H. This circuit implementation is for receiver RF coils.

The amplifiers A1 and A2 are used in a differential mode for larger coil $\mathbf{204}_{Xe}$ for a single channel output, and they are used in common mode for smaller coil $\mathbf{204}_H$ for two channel outputs.

The inputs to the amplifier A1 are connected to a first one of a pair of coils $\mathbf{204}_H$. The inputs to the amplifier A2 are connected to a second one of a pair of coils $\mathbf{204}_H$. The first one of the pair of coils $\mathbf{204}_H$ and the second one of the pair of coils $\mathbf{204}_H$ are connected to a common voltage (e.g., ground). The amplifier A1 therefore measures a voltage across the first one of the pair of coils $\mathbf{204}_H$ and the amplifier A2 therefore measures a voltage across the second one of the pair of coils $\mathbf{204}_H$ The voltage V1 measured by the amplifier A1 across the first one of the pair of coils $\mathbf{204}_H$ is provided via balun $\mathbf{130}_1$ as an output $\mathbf{132}_1$ The voltage V2 measured by the amplifier A2 across the second one of the pair of coils $\mathbf{204}_H$ is provided via balun $\mathbf{130}_2$ as an output $\mathbf{132}_2$ The pair of coils $\mathbf{204}_H$ have portions that are not common which form the coil $\mathbf{204}_{Xe}$. One of the inputs to the amplifier A1 is connected to the coil $\mathbf{204}_{Xe}$ while the other input is connected to the common voltage (e.g., ground). One of the inputs to the amplifier A2 is connected to the coil $\mathbf{204}_{Xe}$ while the other input is connected to the common voltage (e.g., ground). The amplifier A1 therefore measures a voltage across part of coil $\mathbf{204}_{Xe}$ and the amplifier A2 therefore measures a voltage across the other part of the coils $\mathbf{204}_{Xe}$ Theses partial voltages are added to provide the differential voltage across the coil $\mathbf{204}_{Xe}$ The differential voltage is provided via balun $\mathbf{130}_3$ as an output $\mathbf{132}_3$ The amplifiers A1, A2 are broadband such that they can be operated in differential-mode for one frequency (lower Larmor frequency e.g., Larmor frequency of $^{129}$Xe) and common-mode for other frequencies (higher Larmor frequency e.g., Larmor frequency of $^{1}$H)

The passive filter circuit 10 can also find application in low power (<10 W) spectrometers. A low power spectrometer can be used, for example, for monitoring hyperpolarization.

Spin exchange optical pumping (SEOP) can be used to hyperpolarize $^{129}$Xe and a low power (low field) spectrometer can be used for monitoring polarization levels. For example, it can be desirable to know when sufficient hyperpolarization has been achieved. It can be desirable to measure a system's performance to assess when adjustment or maintenance is required.

It would be desirable to have a hyperpolarizer that is configured for SEOP and also has a low-field NMR system 200 for monitoring hyperpolarization.

It would be desirable to have a portable hyperpolarizer that is configured for SEOP and also has a low-field NMR system 200 for monitoring hyperpolarization.

Figure 15:
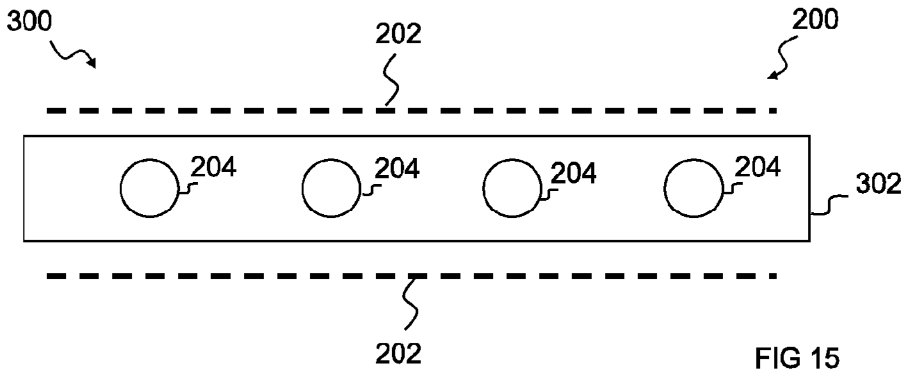
FIG. 15 illustrates an example of a xenon hyperpolarizer that uses a nuclear magnetic resonance (NMR) system.

In FIG. 15, the system 300 comprises an electro-magnet system 202 that is configured to produce the static field, $B_0$.

The system comprises a cell 302 for spin exchange optical pumping (SEOP). The cell receives first nucleus (e.g., $^{129}$Xe) as a gas, polarizes a population of at least the first nucleus, and then provides the polarized gas as an output. The NMR of the second nucleus (e.g., $^{1}$H) is used to calibrate the yield (polarization) of this process using a separate geometrically matched sample of e.g. $H_2O$ The cell 302 itself doesn't receive $^{1}$H. A known quantity of 1H (e.g. water or oil) is positioned within the NMR system 200, but outside the cell 302. RF coil system 204 is used in quadrature and the samples (polarised $^{129}$Xe gas or $^{1}$H) are measured one after the other. This is done by replacing one sample ($^{129}$Xe gas) by the other ($^{1}$H) in the same physical location of the RF coil configuration 204.

The system 200 as previously described can be used to determine the polarization of the first nuclei (e.g. $^{129}$Xe).

A typical operating $B_0$ is ~3 mT, but can it be adjusted for a significant range. This results in a Larmor frequency of 35.3 kHz for $^{129}$Xe ($\gamma$=11.777 MHz/T) and a Larmor frequency of 127.60 kHz for $^1$H ($\gamma$=42.57 MHz/T).

The voltage induced on a coil 204 by an NMR signal is proportional to the magnetization ($M_0$), which for hyperpolarized nuclei is given by $$M_0 = NP\frac{\gamma\hbar}{2}$$

where P is the polarization percent and N is the atomic density.

Identical coils 204 can be placed along a length of the cell so that the polarization distribution in the cell can be measured.

The $^1$H thermal signal (the expected polarization of $^1$H at a certain temperature) is used to calibrate the hyperpolarized $^{129}$Xe signal generated.

The systems previously described can be for nuclear magnetic resonance spectroscopy, nuclear magnetic resonance imaging or nuclear magnetic resonance microscopy. In this document, reference to a subject can be replaced by reference to a sample.

Nuclear magnetic resonance spectroscopy, nuclear magnetic resonance imaging or nuclear magnetic resonance microscopy can be performed using the passive filter circuit 10, or the apparatus 100 or the system 200. The passive filter circuit 10 enables simultaneous creation and/or detection of circularly polarized nuclear spins of opposite polarity.

Nuclear magnetic resonance spectroscopy, nuclear magnetic resonance imaging or nuclear magnetic resonance microscopy can be performed using the simultaneous creation of circularly polarized nuclear spins of opposite polarity in first nuclei and second nuclei and/or using the simultaneous detection of circularly polarized nuclear spins of opposite polarity in first nuclei and second nuclei.

The operation of a dual NMR system 200 can be further improved by providing RF shielding for the $^{129}$Xe RF coils 204$_{Xe}$. The RF shielding improves the quality factor of the coil 204$_{Xe}$, and thereby improves inductive loading and thus overall performance of the RF coil 204$_{Xe}$.

However, the presence of a RF shield can adversely affect NMR of $^1$H due to the fact that the MRI system $^1$H transmit body coil used for transmission is not able to penetrate the RF shield.

Having described detailed implementations where the specific first nucleus is $^1$H and the second nucleus is $^{129}$Xe, it will now be described how these different apparatuses 100, filters 10, circuits and systems can be adapted for use with different combinations of first and second nuclei of opposite polarity gyromagnetic ratio.

The phase rotation block 24 comprises circuitry configured to apply a first phase shift (phase difference) $\Delta\varphi_1$, in a first sense, at the Larmor frequency of the first nucleus and to apply, simultaneously, a second phase shift (phase difference) $\Delta\varphi_2$, in the first sense, at the Larmor frequency of the second nucleus. The first phase shift is in proportion to the Larmor frequency of the first nucleus and the second phase shift $\Delta\varphi_2$ is in proportion to the Larmor frequency of the second nucleus and has the same polarity to the first phase shift, for a certain time delay or equivalent.

Thus, $\Delta\varphi_1/\Delta\varphi_2=\gamma_1/\gamma_2=R$, where $\gamma_1$ is the gyromagnetic ratio of the first nucleus and $\gamma_2$ is the gyromagnetic ratio of the second nucleus. Therefore $\Delta\varphi_2=\Delta\varphi_1/|R|$ where $|R|$ is the modulus value of the ratio of the gyromagnetic ratio $\gamma_1$ of the first nucleus and the gyromagnetic ratio $\gamma_2$ of the second nucleus.

The phase offset block 26 comprises circuitry configured to apply a relative phase offset $\theta$ between the first phase shift (phase difference) $\Delta\varphi_1$ at the Larmor frequency of the first nucleus and the second phase shift (phase difference) $\Delta\varphi_2$ at the Larmor frequency of the second nucleus to create a phase difference $\beta$ between the first phase shift and the second phase shift, after the offset. If the second phase shift (phase difference) after the offset is $\Delta\varphi_2$*b, then $\beta=\Delta\varphi_1-\Delta\varphi_2*b=\Delta\varphi_1\ (1-b/|R|)$.

The phase difference $\beta$ is summed across N cascaded filter modules to provide the output 14 that has a quadrature phase shift (−phase change) of a first polarity at the Larmor frequency of the first nucleus and a quadrature phase shift (phase change) of the second polarity, opposite the first polarity, at the Larmor frequency of the second nucleus.

Thus, the N relative phase differences $\beta$ sum to a relative phase difference of 180°.

Figure 16A:
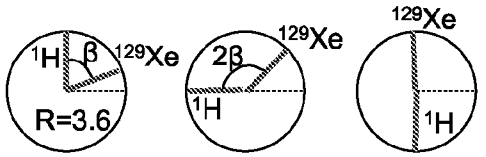
FIGS. 16A and 16B illustrate phase changes over multiple changes at the Larmor frequencies of the first and second nucleus to obtain a desired relative phase offset.

This is illustrated in FIG. 16A when the first nucleus is $^1$H and the second nucleus is $^{129}$Xe and N=3.

Figure 16B:
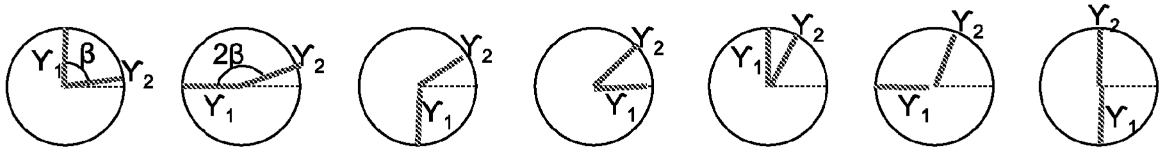

A generic example, is illustrated in FIG. 16B where the first nucleus $\gamma_1$ is unspecified and the second nucleus $\gamma_2$ is unspecified. There are however the constraints that the magnitude of gyromagnetic ratio of the first nucleus is greater than the magnitude of gyromagnetic ratio of the second nucleus and that the gyromagnetic ratio of the first nucleus and the gyromagnetic ratio of the second nucleus have opposite polarity.

This means that the total phase difference after N stages (N*$\beta$) is N*$\Delta\varphi_1$ (1−b/|R|) and is equivalent to 180°

For the purposes of simplicity of illustration, the first phase shift (phase difference) $\Delta\varphi_1$ is scaled to be +90°. Thus, after N stages the first phase shift $\Delta\varphi_1$ is equivalent to −90° and the second phase shift (phase difference) $\Delta\varphi_2$ is equivalent to +90°. The second phase shift is $\Delta\varphi_1$*b/|R|, and equivalent to +90° after N stages, thus b=|R|/N. The second phase shift is $\Delta\varphi_1$/|R|+6, and equivalent to +$\pi$/2 after N stages, thus $$\theta = \frac{\pi}{2}\left(\frac{1}{N} - \frac{1}{|R|}\right).$$

In FIG. 6, a suitable value for the shunt capacitors C1, C2 introduces a phase delay per stage of substantially 180°/2N at the Larmor frequency of the second nucleus and a phase delay per stage of substantially 90° at the Larmor frequency of the first nucleus.

For $^1$H $^{129}$Xe |R|=3.6, $\Delta\varphi_1$=90°=>$\Delta\varphi_2$=90°/|R|=25°, for N=3:

$$\theta = \frac{\pi}{2}\left(\frac{1}{N} - \frac{1}{|R|}\right) = 5° \text{ (0.0873 rad)},$$

b=|R|/N=1.2 and for $^{129}$Xe the phase shift after 3 stages is 3*(25°+5°)=90°.

For $^{1}H$, $^{15}N$, |R|=9.866, $\Delta\varphi_1$=90°=>$\Delta\varphi_2$=90°/|R|=9.12°, for $$N=7:\ \theta=\frac{\pi}{2}\left(\frac{1}{N}-\frac{1}{|R|}\right)=3.73^{\circ}\ (0.651\ \text{rad}),$$

b=|R|/N=1.41 and for $^{15}N$ the phase shift after 7 stages is 7*(9.12°+3.73°)=90°.

For $^{1}H$, $^{17}O$, |R|=7.377, $\Delta\varphi_1$=90°=>$\Delta\varphi_2$=90°/|R|=12.2°, for $$N=7:\ \theta=\frac{\pi}{2}\left(\frac{1}{N}-\frac{1}{|R|}\right)=0.66^{\circ}\ (0.0115\ \text{rad}),$$

b=1.054 and for $^{17}O$ the phase shift after 7 stages is 7*(12.2°+0.66°)=90°.

It is preferred to keep θ small.

While it is preferable for the total phase difference after N stages (N*β) to be equivalent to 180°, it can be substantially of the order of 180° and does not necessarily have to be exactly 180°.

While it can be preferable, after N stages, for the accumulation of first phase shift (phase difference) $\Delta\varphi_1$ to be −90° it can be substantially of the order of −90° and does not necessarily have to be exactly 90°.

While it can be preferable, after N stages, for the accumulation of second phase shift (phase difference) $\Delta\varphi_2$ to be +90° it can be substantially of the order of +90° and does not necessarily have to be exactly +90°.

Where a structural feature has been described, it may be replaced by means for performing one or more of the functions of the structural feature whether that function or those functions are explicitly or implicitly described.

The term 'comprise' is used in this document with an inclusive not an exclusive meaning. That is any reference to X comprising Y indicates that X may comprise only one Y or may comprise more than one Y. If it is intended to use 'comprise' with an exclusive meaning then it will be made clear in the context by referring to "comprising only one." or by using "consisting".

In this description, reference has been made to various examples. The description of features or functions in relation to an example indicates that those features or functions are present in that example. The use of the term 'example' or 'for example' or 'can' or 'may' in the text denotes, whether explicitly stated or not, that such features or functions are present in at least the described example, whether described as an example or not, and that they can be, but are not necessarily, present in some of or all other examples. Thus 'example', 'for example', 'can' or 'may' refers to a particular instance in a class of examples. A property of the instance can be a property of only that instance or a property of the class or a property of a sub-class of the class that includes some but not all of the instances in the class. It is therefore implicitly disclosed that a feature described with reference to one example but not with reference to another example, can where possible be used in that other example as part of a working combination but does not necessarily have to be used in that other example.

Although examples have been described in the preceding paragraphs with reference to various examples, it should be appreciated that modifications to the examples given can be made without departing from the scope of the claims.

Features described in the preceding description may be used in combinations other than the combinations explicitly described above.

Although functions have been described with reference to certain features, those functions may be performable by other features whether described or not.

Although features have been described with reference to certain examples, those features may also be present in other examples whether described or not.

The term 'a' or 'the' is used in this document with an inclusive not an exclusive meaning. That is any reference to X comprising a/the Y indicates that X may comprise only one Y or may comprise more than one Y unless the context clearly indicates the contrary. If it is intended to use 'a' or 'the' with an exclusive meaning then it will be made clear in the context. In some circumstances the use of 'at least one' or 'one or more' may be used to emphasis an inclusive meaning but the absence of these terms should not be taken to infer any exclusive meaning.

The presence of a feature (or combination of features) in a claim is a reference to that feature or (combination of features) itself and also to features that achieve substantially the same technical effect (equivalent features). The equivalent features include, for example, features that are variants and achieve substantially the same result in substantially the same way. The equivalent features include, for example, features that perform substantially the same function, in substantially the same way to achieve substantially the same result.

In this description, reference has been made to various examples using adjectives or adjectival phrases to describe characteristics of the examples. Such a description of a characteristic in relation to an example indicates that the characteristic is present in some examples exactly as described and is present in other examples substantially as described.

Whilst endeavoring in the foregoing specification to draw attention to those features believed to be of importance it should be understood that the Applicant may seek protection via the claims in respect of any patentable feature or combination of features hereinbefore referred to and/or shown in the drawings whether or not emphasis has been placed thereon.

We claim:

1. A passive filter circuit, for simultaneous dual-nuclear magnetic resonance quadrature transmit-receive that is configured to apply to an input a quadrature phase shift of a first polarity at a Larmor frequency of a first nucleus and a quadrature phase shift of a second polarity, that is opposite the first polarity, at the Larmor frequency of a second nucleus.

2. A passive filter circuit as claimed in claim 1, comprising at least a second-order filter.

3. A passive filter circuit as claimed in claim 1, comprising multiple cascaded filter modules.

4. A passive filter circuit as claimed in claim 3, wherein each cascaded filter module is the same.

5. A passive filter circuit as claimed in claim 3, wherein each cascaded filter module is configured to provide a relative phase shift that in combination across the passive filter circuit results in an output that has a quadrature phase shift of a first polarity at the Larmor frequency of the first nucleus and a quadrature phase shift of the second polarity, opposite the first polarity, at the Larmor frequency of the second nucleus.

6. A passive filter circuit as claimed in claim 5, wherein each module comprises at least a second-order filter.

7. A passive filter circuit as claimed in claim 5, wherein each module comprises:

circuitry configured to apply a first phase shift, in a first sense, at the Larmor frequency of the first nucleus and in proportion to the Larmor frequency of the first nucleus and apply a second phase shift, in the first sense, at the Larmor frequency of the second nucleus and in proportion to the Larmor frequency of the second nucleus; and circuitry configured to apply an offset between the first phase shift at the Larmor frequency of the first nucleus and the second phase shift at the Larmor frequency of the second nucleus to create a phase difference between the first phase shift and the second phase shift, after the offset, that is used to provide the output that has the quadrature phase shift of the first polarity at the Larmor frequency of the first nucleus and the quadrature phase shift of the second polarity, opposite the first polarity, at the Larmor frequency of the second nucleus.

8. A passive filter circuit as claimed in claim 7, wherein the offset between the first phase shift at the Larmor frequency of the first nucleus and the second phase shift at the Larmor frequency of the second nucleus creates a phase difference between the first phase shift and the second phase shift, after the offset, that can be multiplied by a whole number to obtain a net 180° phase difference.

9. A passive filter circuit as claimed in claim 3, configured to control a change in the number of multiple cascaded filter modules and/or control changes in component values of the multiple cascaded filter modules for different combinations for first nucleus and second nucleus.

10. A passive filter circuit as claimed in claim 3, wherein there are three cascaded filter modules and each filter module introduces a relative phase shift of 90 degrees at a Larmor frequency of a $^{1}$H nucleus and introduces a relative phase shift of 30 degrees at a Larmor frequency of a $^{129}$Xe nucleus.

11. A passive filter circuit as claimed in claim 10 wherein each module comprises: circuitry configured to apply a −90° phase shift at the Larmor frequency of the $^{1}$H nucleus and apply a substantially −25° phase shift at the Larmor frequency of the $^{129}$Xe nucleus; and circuitry configured to apply an offset of substantially −5° phase shift at the Larmor frequency of the $^{129}$Xe nucleus compared to the Larmor frequency of the $^{1}$H nucleus.

12. An apparatus, for simultaneous dual nuclear magnetic resonance, comprising:

one or more passive filter circuits as claimed in claim 1, and configured to provide a first output signal with the quadrature phase shift of the first polarity at the Larmor frequency of the first nucleus and to provide the second output signal with the quadrature phase shift of the second polarity, opposite the first polarity, at the Larmor frequency of the second nucleus.

13. An apparatus as claimed in claim 12 configured as a transmitter for simultaneous dual nuclear magnetic resonance and/or a receiver for simultaneous dual nuclear magnetic resonance.

14. An apparatus as claimed in claim 12 comprising:

a first coil arrangement coupled to the first output signal with the quadrature phase shift of the first polarity at the Larmor frequency of the first nucleus to produce a first magnetic field and to the second output signal with the quadrature phase shift of the second polarity, opposite the first polarity, at the Larmor frequency of the second nucleus to produce a second magnetic field, wherein one of the first magnetic field and the second magnetic field is right circularly polarized and the other one of the first magnetic field and the second magnetic field is left circularly polarized.

15. An apparatus as claimed in claim 14, wherein the first coil arrangement is configured as a jacket to be worn by a human subject.

16. An apparatus as claimed in claim 14, wherein the first coil arrangement comprises first coils coupled to the first output signal to produce the first magnetic field and comprises second coils coupled to the second output signal to produce the second magnetic field, wherein in use the first magnetic field is substantially in a first direction and the second magnetic field is substantially in a second direction orthogonal to the first direction.

17. A system comprising the apparatus as claimed in claim 12 and a passive jacket, for dual-nuclear magnetic resonance quadrature transmit-receive on a subject, comprising circuitry configured to produce-detect a first magnetic field that has a first circular polarization at the Larmor frequency of the first nucleus and to produce-detect a second magnetic field that has a second circular polarization at the Larmor frequency of the second nucleus, where the first circular polarization is opposite the second polarization at the subject.

18. An apparatus for simultaneous dual nuclear magnetic resonance, comprising:

a quadrature hybrid circuit configured to provide a first output signal to a first passive filter circuit and to provide a second output signal to a second passive filter circuit, wherein the first output signal and the second output signal have a quadrature phase difference at both the Larmor frequency of the first nucleus and at the Larmor frequency of the second nucleus and wherein one of the first and second passive filter circuit is as claimed in claim 1; or a quadrature hybrid circuit configured to provide a first output signal and a second output signal wherein the first output signal and the second output signal have a quadrature phase difference of opposite polarity at the Larmor frequency of the first nucleus and at the Larmor frequency of the second nucleus, the quadrature hybrid circuit comprising multiple passive filter circuits as claimed in claim 1 including at least one passive filter circuit connected between a first output and a second output that provide the first output signal and the second output signal.

19. A system for simultaneous dual nuclear magnetic resonance on the first nucleus and the second nucleus, the system comprising the passive filter circuit as claimed in claim 1, wherein the first nucleus and the second nucleus have gyromagnetic ratios of opposite polarity.

20. A system as claimed in claim 19, wherein the system is configured for simultaneous dual nuclear magnetic resonance on the first nucleus and the second nucleus without using time divided switching.

21. A system as claimed in claim 19, wherein the first nucleus is $^{1}$H and the second nucleus is hyperpolarized $^{129}$Xe and the system comprises a hyperpolarizer for producing the hyperpolarized $^{129}$Xe.

22. A system as claimed in claim 19, configured for nuclear magnetic resonance spectroscopy, nuclear magnetic resonance imaging or nuclear magnetic resonance microscopy.

23. A method of performing nuclear magnetic resonance spectroscopy, nuclear magnetic resonance imaging or nuclear magnetic resonance microscopy, the method comprising using the passive filter circuit of claim 1, wherein the passive filter circuit enables simultaneous creation and/or detection of circularly polarized nuclear spins of opposite polarity.

24. A method of performing nuclear magnetic resonance spectroscopy, nuclear magnetic resonance imaging or nuclear magnetic resonance microscopy comprising: using a passive filter circuit that enables the simultaneous creation of circularly polarized nuclear spins of opposite polarity in a first nucleus and a second nucleus and simultaneous detection of circularly polarized nuclear spins of opposite polarity in the first nucleus and the second nucleus, wherein the passive filter circuit causes a nuclear spin of the first nucleus to have a quadrature phase shift of a first polarity at a Larmor frequency of the first nucleus and a nuclear spin of the second nucleus to have a quadrature phase shift of a second polarity, that is opposite the first polarity, at the Larmor frequency of the second nucleus.

* * * * *